(12) United States Patent
Meyer et al.

(10) Patent No.: US 12,364,070 B2
(45) Date of Patent: Jul. 15, 2025

(54) SELF-SUPPORTING WAVELENGTH-CONVERTING PHOSPHOR LAYER

(71) Applicant: LUMILEDS LLC, San Jose, CA (US)

(72) Inventors: Jens Meyer, Aachen (DE); Niels Jeroen Van Der Veen, Schiphol (NL); Ronja Missong, Aachen (DE)

(73) Assignee: Lumileds LLC, San Jose, CA (US)

( * ) Notice: Subject to any disclaimer, the term of this patent is extended or adjusted under 35 U.S.C. 154(b) by 383 days.

(21) Appl. No.: 17/869,933

(22) Filed: Jul. 21, 2022

(65) Prior Publication Data

US 2022/0359795 A1 Nov. 10, 2022

Related U.S. Application Data

(63) Continuation of application No. PCT/US2021/014565, filed on Jan. 22, 2021.

(30) Foreign Application Priority Data

Jan. 23, 2020 (EP) .................................. 20153301

(51) Int. Cl.
*H01L 33/50* (2010.01)
*H10H 20/851* (2025.01)

(52) U.S. Cl.
CPC .... *H10H 20/8512* (2025.01); *H10H 20/8515* (2025.01)

(58) Field of Classification Search
CPC ... H01L 33/502; H01L 33/507; H01L 33/505; F21K 9/64; H10H 20/8512; H10H 20/8515; H10H 20/0361; H10H 20/8514
See application file for complete search history.

(56) References Cited

U.S. PATENT DOCUMENTS 11,177,420 B2 11/2021 Lopez-Julia et al.
11,257,986 B2 2/2022 Meyer et al.
(Continued)

FOREIGN PATENT DOCUMENTS

EP 2487218 A1 8/2012
EP 2645433 A2 10/2013
(Continued)

OTHER PUBLICATIONS

The extended European search report corresponding to 20153301.5 dated Jul. 24, 2020, 7 pages.
(Continued)

*Primary Examiner* — Tracie Y Green

(57) ABSTRACT

A layer of multiple phosphor particles is formed on a surface of a substrate, and inorganic material is formed or deposited to embed at least partially the layer of phosphor particles on the substrate. A wavelength-converting layer is thus formed, including the phosphor particles and the inorganic material, that is then separated from the substrate. The inorganic material binds together the phosphor particles so that the wavelength-converting layer is self-supporting. In some examples, before separating the wavelength-converting layer from the substrate, a release member can be adhered to a surface of the wavelength-converting layer opposite the substrate; the wavelength-converting layer can remain adhered to the release member after separation from the substrate. In some examples the wavelength-converting layer can be adhered to a light-emitting surface of a semiconductor light-emitting device.

20 Claims, 12 Drawing Sheets

(56) References Cited

U.S. PATENT DOCUMENTS

| | | |
|---|---|---|
| 11,362,243 B2 | 6/2022 | Lopez-Julia et al. |
| 11,411,146 B2 | 8/2022 | Meyer et al. |
| 11,552,225 B2 | 1/2023 | Bechtel et al. |
| 2005/0093008 A1 | 5/2005 | Suehiro et al. |
| 2011/0248305 A1* | 10/2011 | Ling ................ H01L 33/505 |
| | | 257/E33.061 |
| 2013/0257264 A1* | 10/2013 | Tamaki ................ B05D 5/06 |
| | | 313/503 |
| 2013/0307010 A1* | 11/2013 | Hikmet ............... H01L 33/502 |
| | | 257/98 |
| 2016/0141462 A1* | 5/2016 | Ling ................ H01L 33/505 |
| | | 428/323 |
| 2016/0149097 A1 | 5/2016 | Saka et al. |
| 2020/0141561 A1* | 5/2020 | Grottenmueller .. B29D 11/0074 |
| 2020/0411736 A1 | 12/2020 | Bechtel et al. |
| 2022/0320390 A1 | 10/2022 | Lopez-Julia |

FOREIGN PATENT DOCUMENTS

| | | |
|---|---|---|
| EP | 3358381 A1 | 8/2018 |
| JP | 2013216800 A | 10/2013 |
| JP | 2013247067 A | 12/2013 |

OTHER PUBLICATIONS

From the EPO as the ISA, International Search Report corresponding to PCT/US2021/014565 dated Apr. 16, 2021, 12 pages.

\* cited by examiner

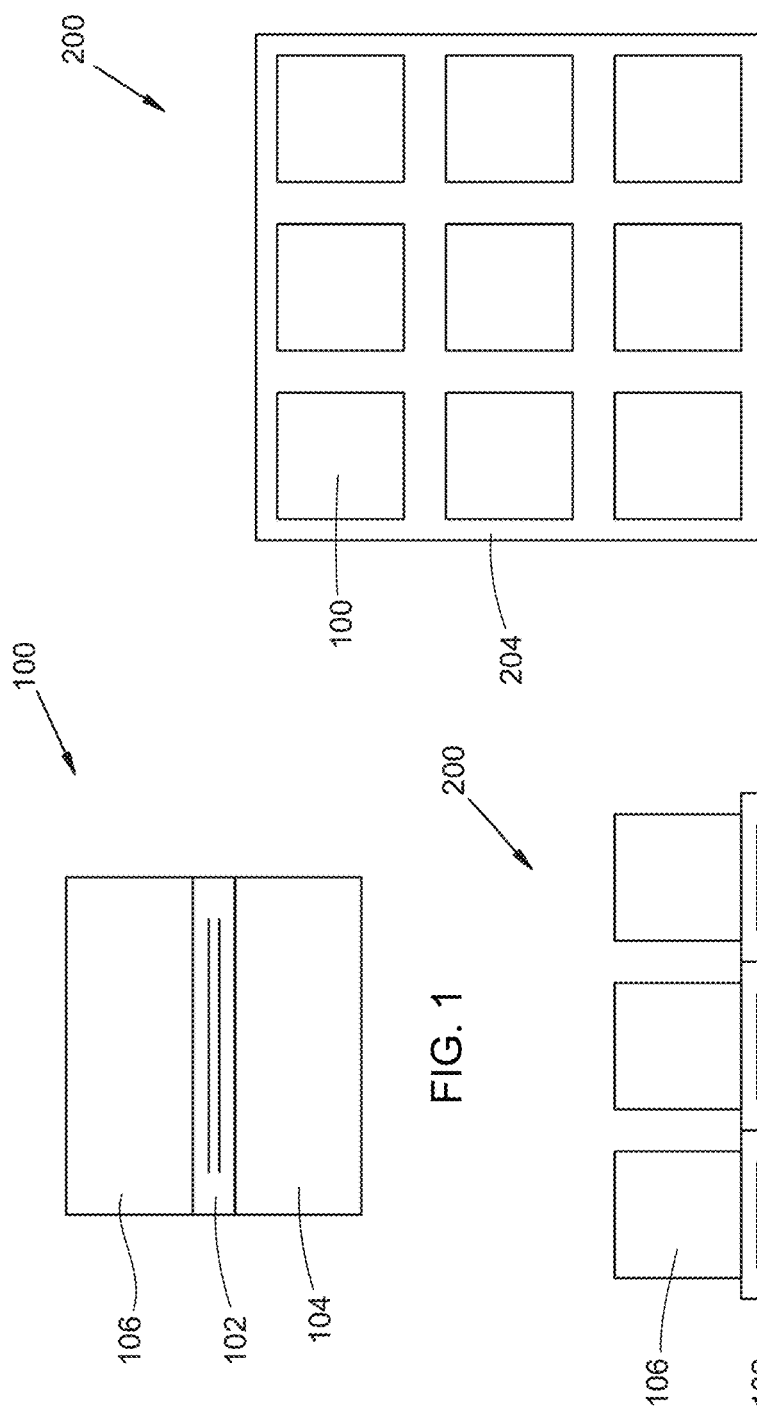

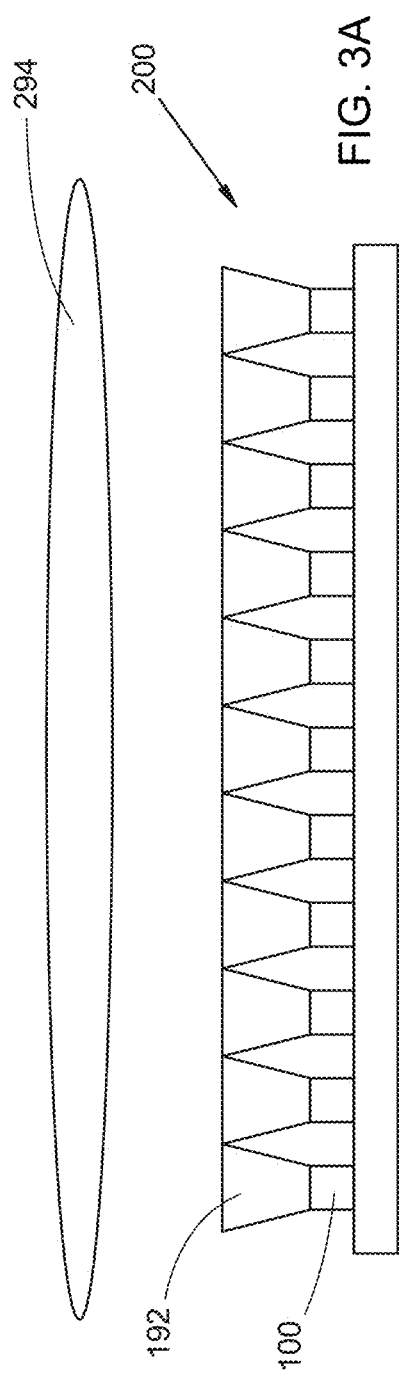
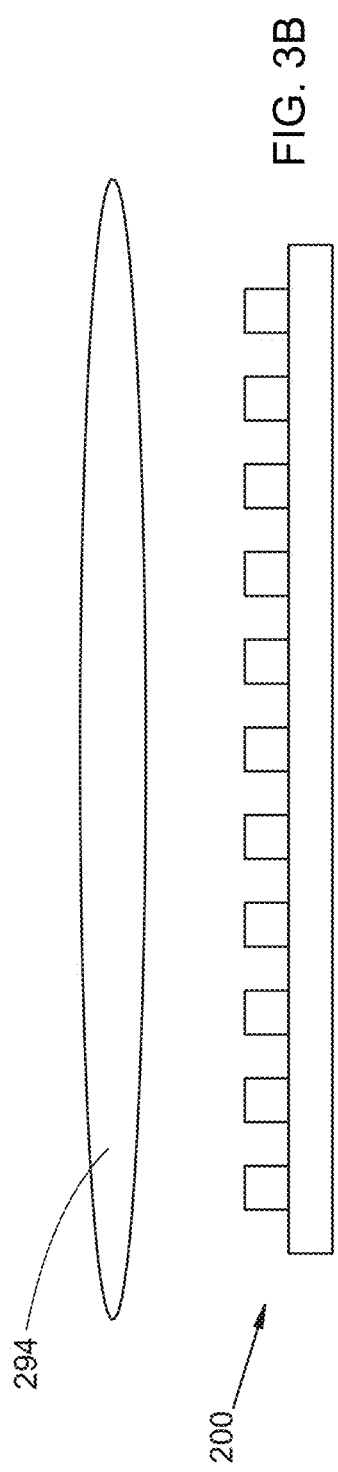

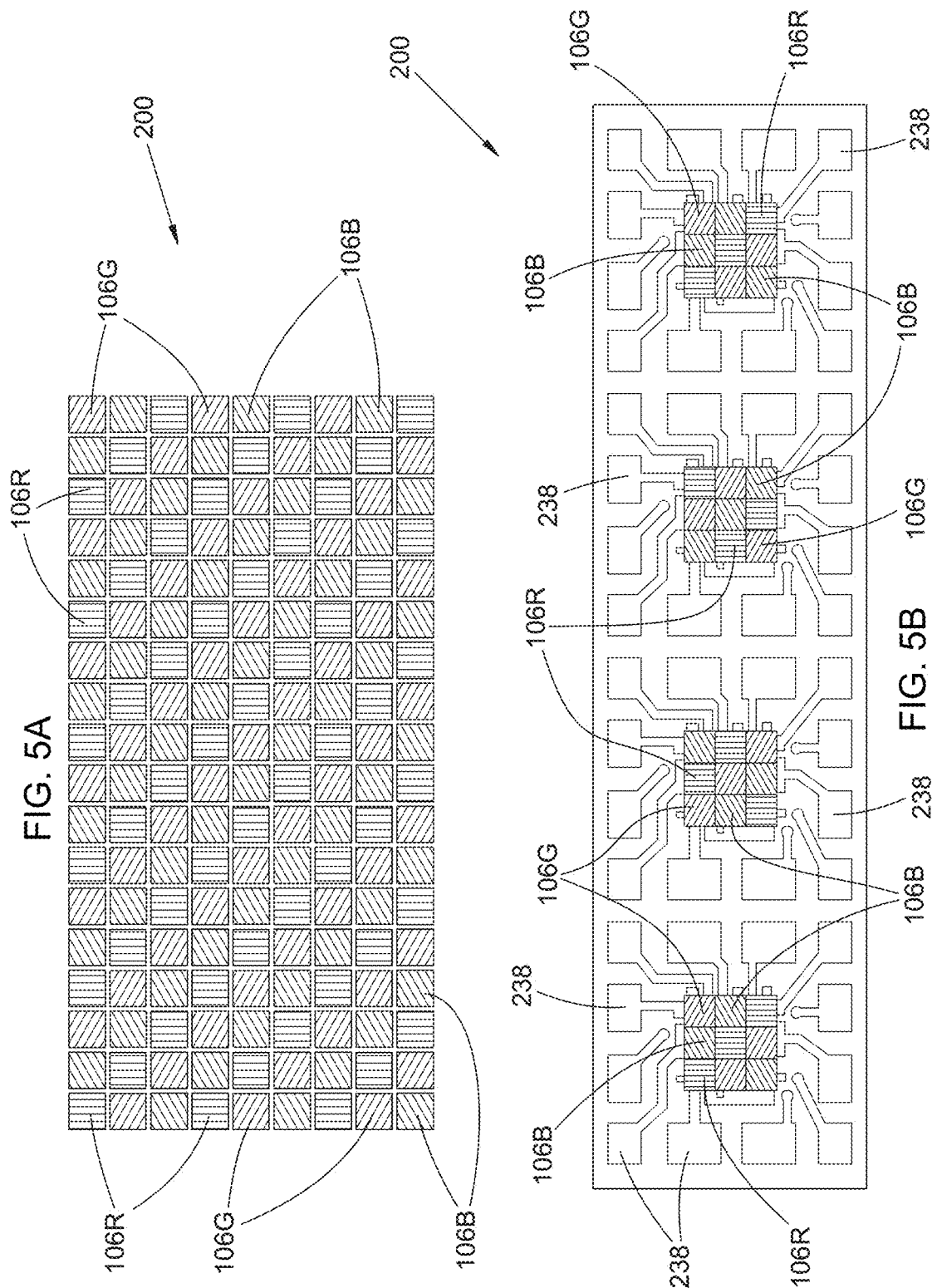

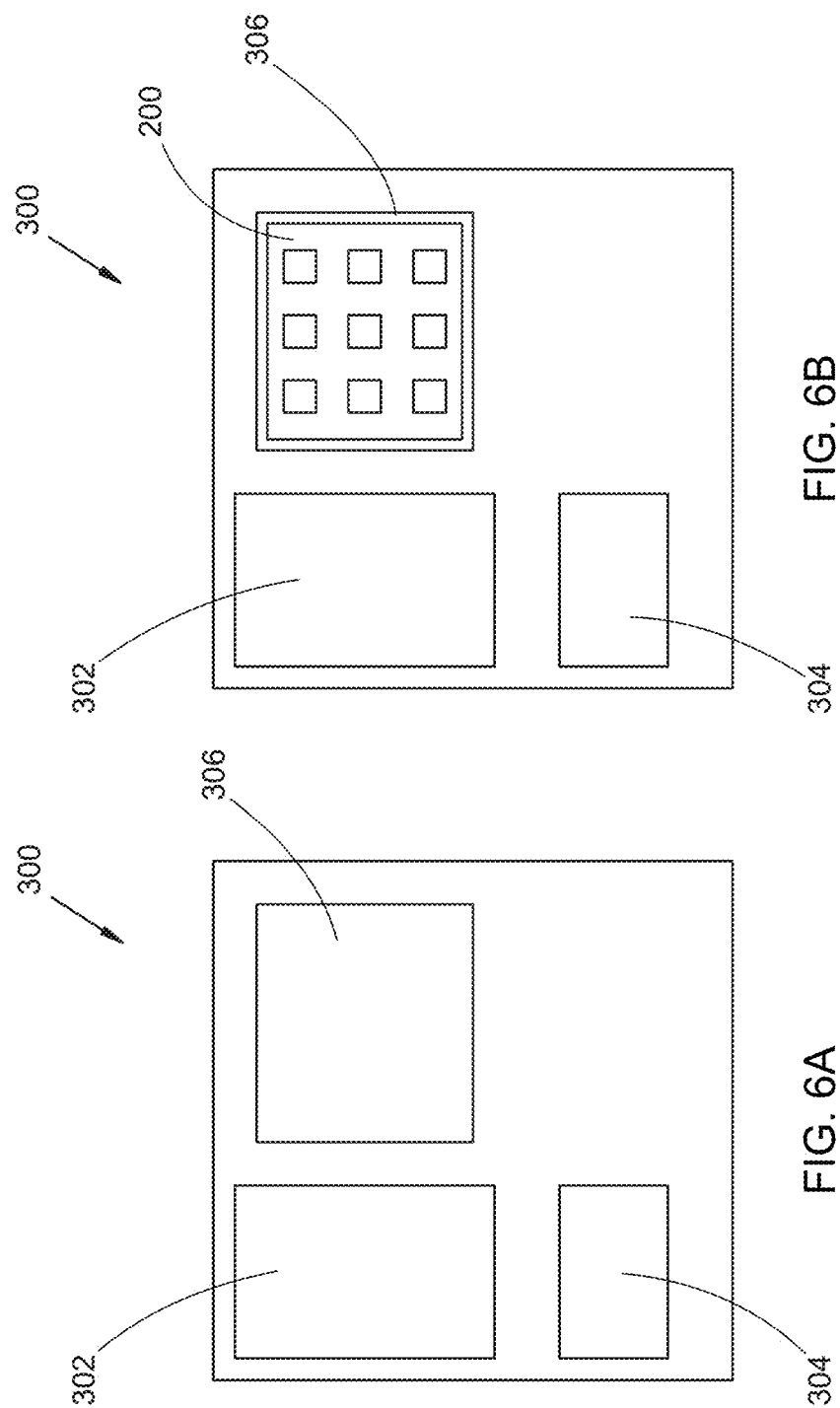

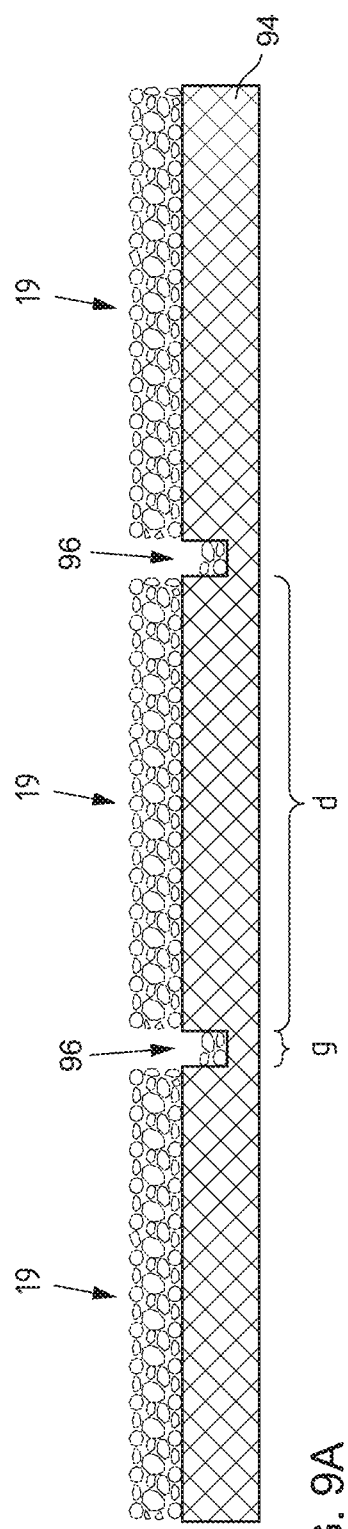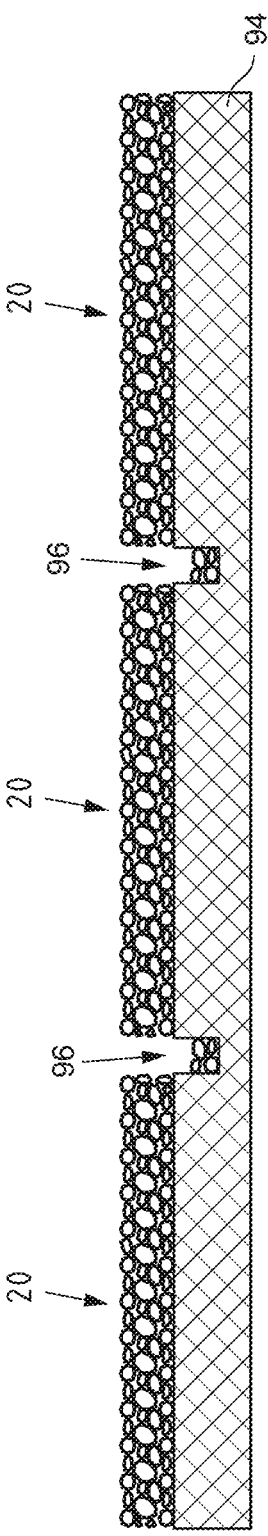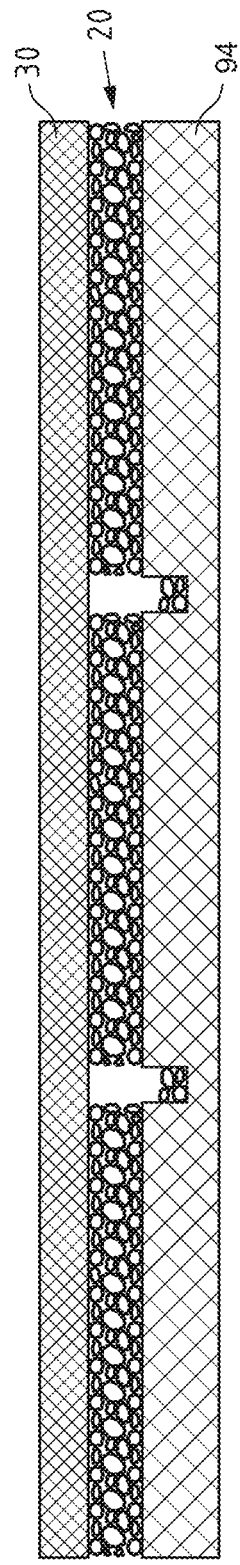

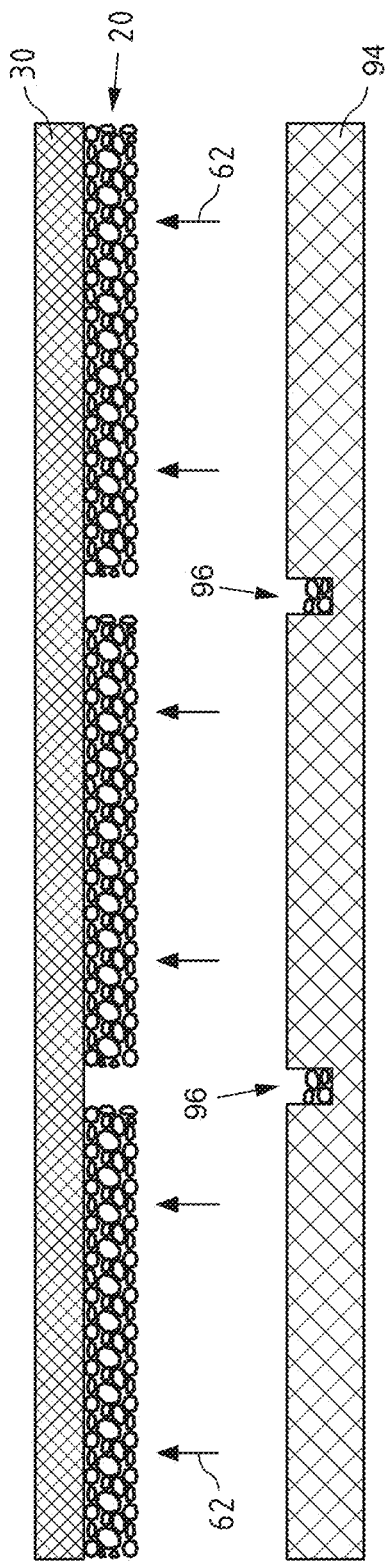
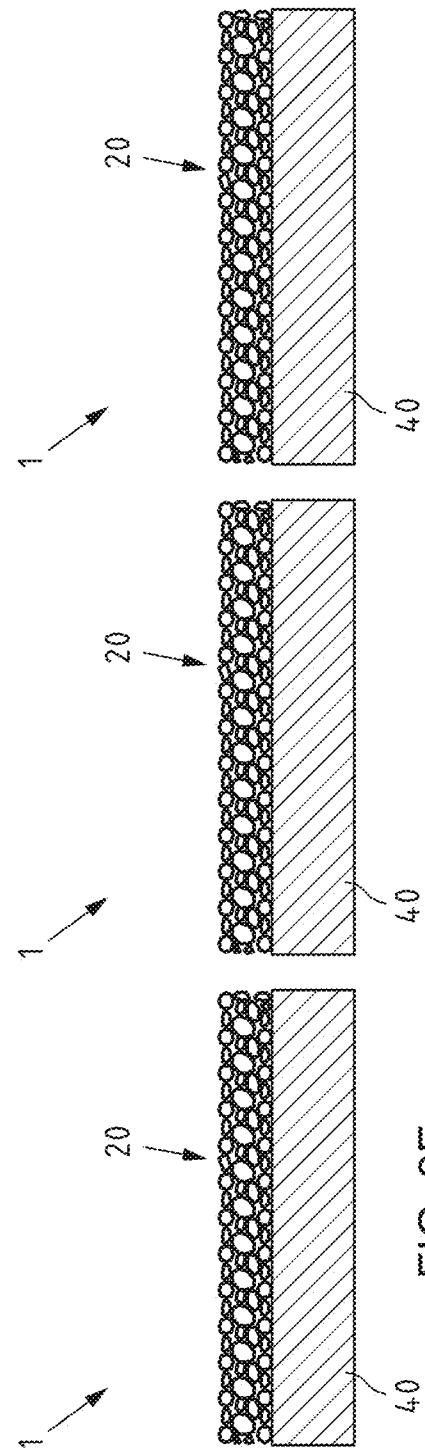
FIG. 9D
FIG. 9E

SELF-SUPPORTING WAVELENGTH-CONVERTING PHOSPHOR LAYER

RELATED APPLICATIONS

This application is a continuation of PCT App. No. PCT/US2021/014565 entitled "Self-supporting wavelength-converting phosphor layer" filed 22 Jan. 2021, which claims priority of EP App No 20153301 entitled "Manufacturing phosphor wavelength conversion layer" filed 23 Jan. 2020; both of said applications are incorporated herein by reference in their entireties.

FIELD OF THE INVENTION

The invention relates generally to phosphor-converted light-emitting diodes.

BACKGROUND

Semiconductor light-emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength-converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, camera flash sources, or flashlights (i.e., torches). An array having one or several or many individual devices per millimeter (e.g., device pitch of about a millimeter, a few hundred microns, or less than 100 microns, and spacing between adjacent devices less than 100 microns or only a few tens of microns or less) typically is referred to as a miniLED array or a microLED array (alternatively, a pLED array). Such mini- or microLED arrays can in many instances also include phosphor converters as described above; such arrays can be referred to as pc-miniLED or pc-microLED arrays.

SUMMARY

An inventive method comprises forming a layer of multiple phosphor particles on a surface of a substrate, and forming or depositing inorganic material that at least partially embeds the layer of phosphor particles on the substrate. A wavelength-converting layer is thus formed, comprising the phosphor particles and the inorganic material, that is then separated from the substrate. The inorganic material binds together the phosphor particles so that the wavelength-converting layer is self-supporting.

In some examples, before separating the wavelength-converting layer from the substrate, a release member can be adhered to a surface of the wavelength-converting layer opposite the substrate; the wavelength-converting layer can remain adhered to the release member after separation from the substrate. In some examples the wavelength-converting layer can be adhered to a light-emitting surface of a semiconductor light-emitting device.

Objects and advantages pertaining to pcLEDs, pc-miniLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 shows a schematic cross-sectional view of an example pcLED.

FIGS. 2A and 2B show, respectively, cross-sectional and top schematic views of an example array of pcLEDs.

FIG. 3A shows a schematic cross-sectional view of an example array of pcLEDs arranged with respect to waveguides and a projection lens. FIG. 3B shows an arrangement similar to that of FIG. 3A, but without the waveguides.

FIG. 5A is a schematic top view of a portion of an example LED display in which each display pixel is a red, green, or blue phosphor-converted LED pixel. FIG. 5B is a schematic top view of a portion of an example LED display in which each display pixel includes multiple phosphor-converted LED pixels (red, green, and blue) integrated onto a single die that is bonded to a control circuit backplane.

FIG. 6A shows a schematic top view an example electronics board on which an array of pcLEDs may be mounted, and FIG. 6B similarly shows an example array of pcLEDs mounted on the electronic board of FIG. 6A.

FIGS. 9A-9E illustrate schematically another example of an inventive method.

Figure 4A:
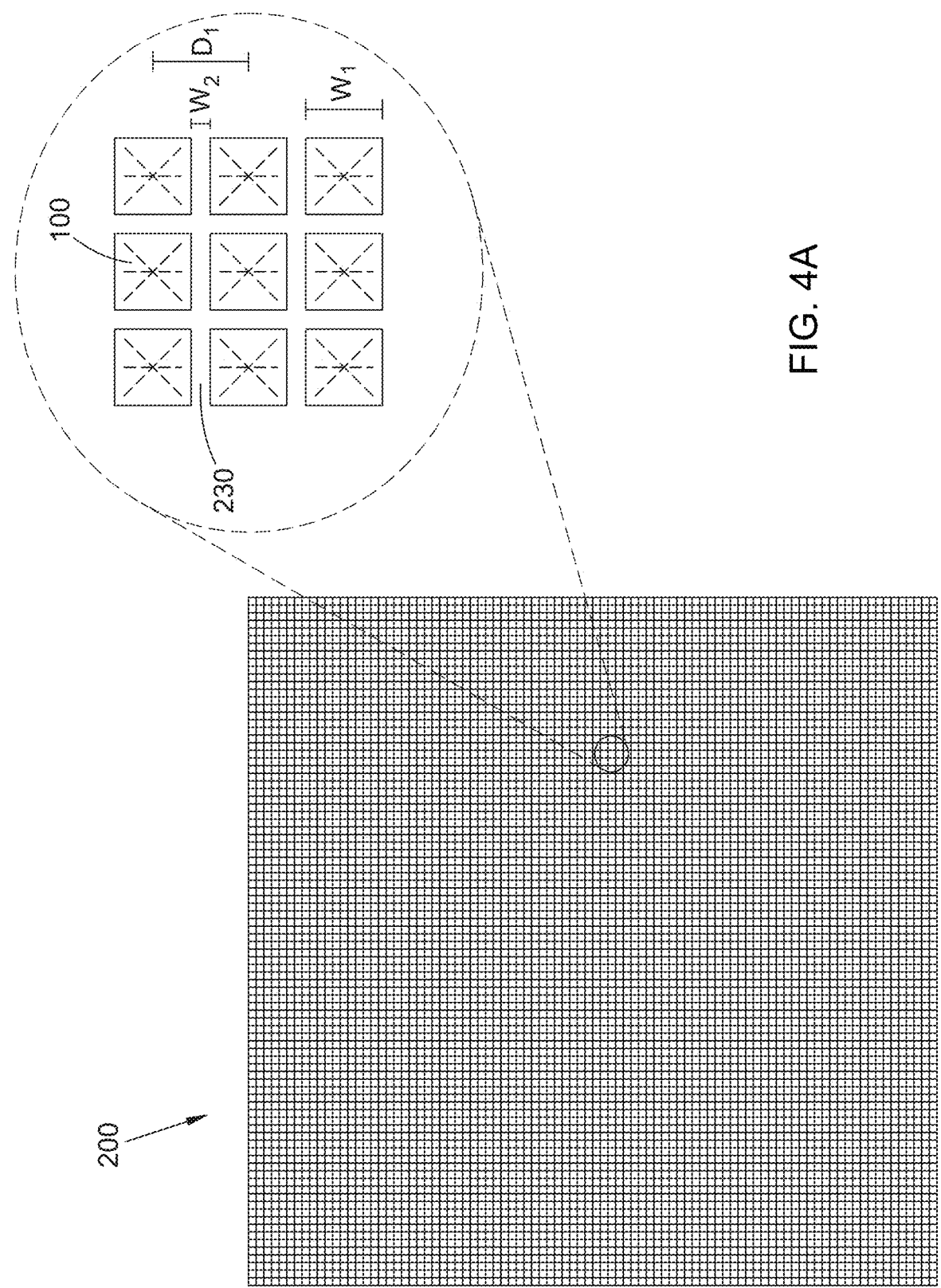
FIG. 4A shows a top schematic view of an example miniLED or microLED array and an enlarged section of 3×3 LEDs of the array.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the invention. The detailed description illustrates by way of example, not by way of limitation, the principles of the invention.

FIG. 1 shows an example of an individual pcLED 100 comprising a semiconductor diode structure 102 disposed on a substrate 104, together considered herein an "LED" or "semiconductor LED", and a wavelength-converting structure (e.g., phosphor layer) 106 disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Suitable material systems may include, for example, various III-Nitride materials, various III-Phosphide materials, various III-Arsenide materials, and various II-VI materials.

Any suitable phosphor materials may be used for or incorporated into the wavelength-converting structure 106, depending on the desired optical output from the pcLED.

FIGS. 2A-2B show, respectively, cross-sectional and top views of an array 200 of pcLEDs 100, each including a phosphor pixel 106, disposed on a substrate 204. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 204 may optionally include electrical traces or interconnects, or CMOS or other circuitry for driving the LED, and may be formed from any suitable materials.

Individual pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications. A miniLED or microLED display application may use similar optical arrangements to those depicted in FIGS. 3A and 3B, for example. Generally, any suitable arrangement of optical elements may be used in combination with the pcLEDs described herein, depending on the desired application.

Although FIGS. 2A and 2B show a 3×3 array of nine pcLEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch $D_1$ is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
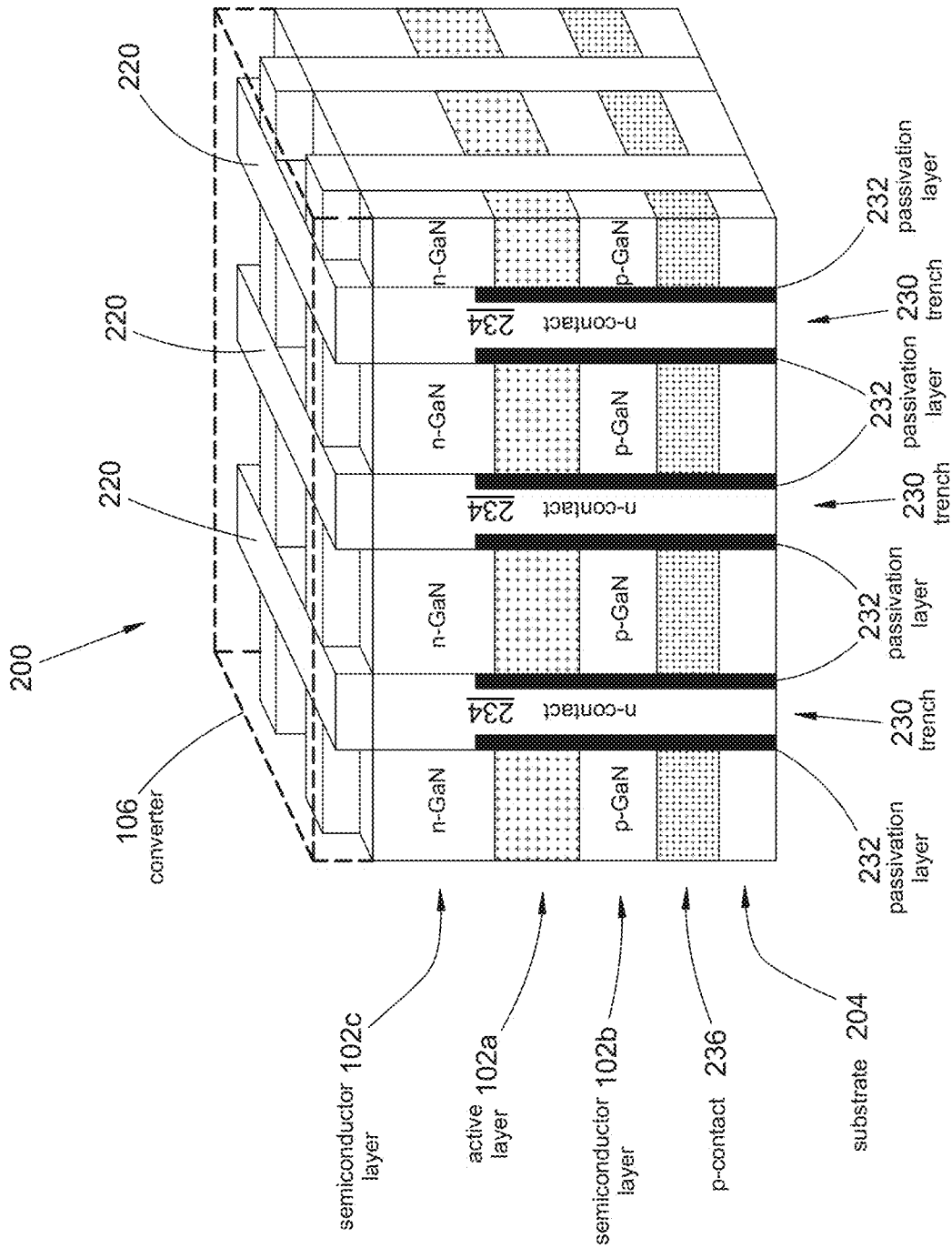
FIG. 4B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102b, an active region 102a, and an n-GaN semiconductor layer 102c; the layers 102a/102b/102c collectively form the semiconductor LED 102. A wavelength-converting material 106 may be deposited on the semiconductor layer 102c (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

Figure 4C:
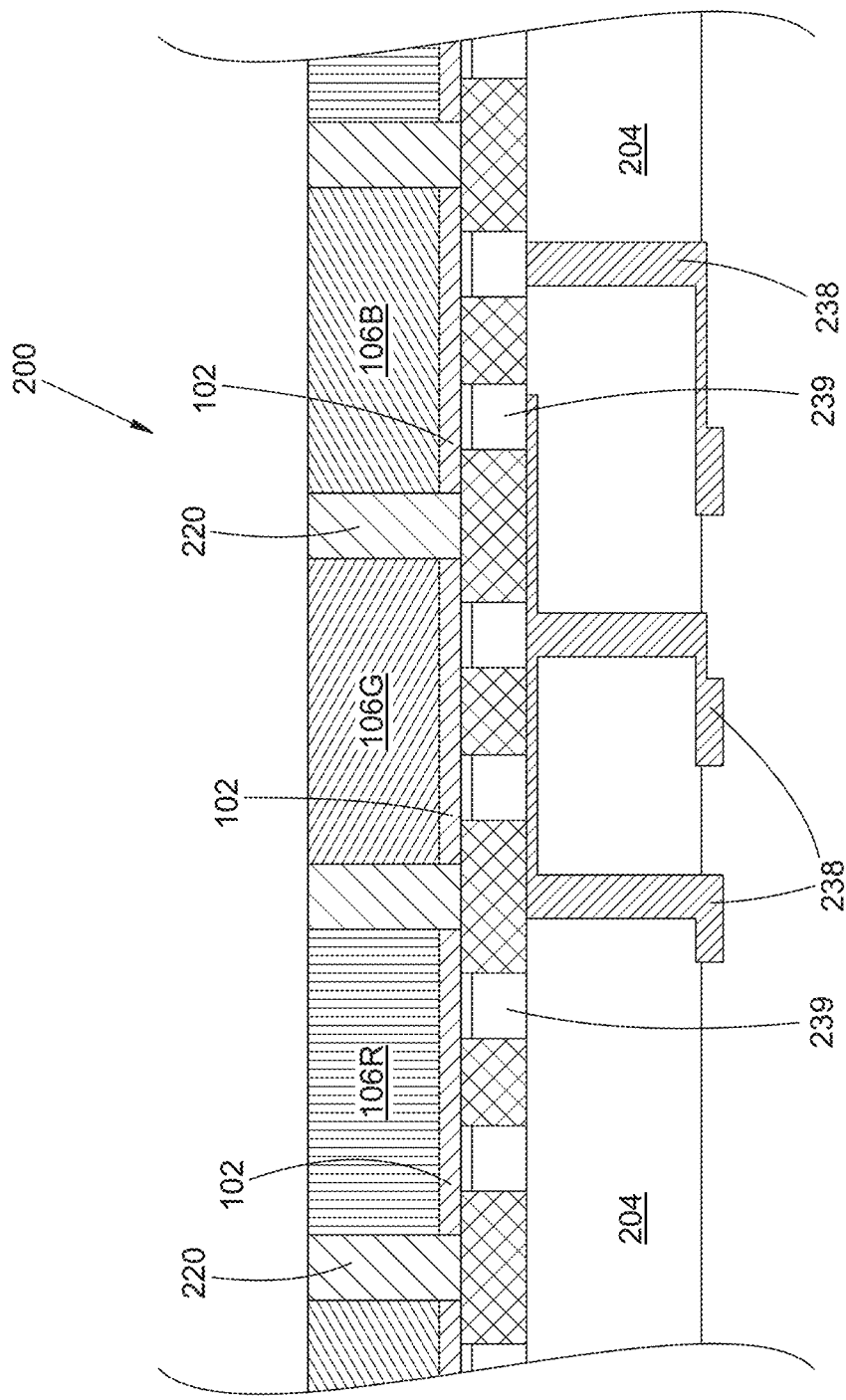
FIG. 4C is a side cross-sectional schematic diagram of an example of a close-packed array of multi-colored phosphor-converted LEDS on a monolithic die and substrate.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light-emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light-emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

In some instances wavelength-converting phosphor layers can be fabricated for example by providing an initial layer of phosphor particles (e.g., a phosphor powder) on a light-emitting surface of an LED die. Subsequently, the phosphor particles are then incorporated or embedded into a suitable inorganic material to mechanically and optically couple the resulting initial layer comprising phosphor particles and the inorganic material with the light-emitting surface of the LED die.

Thin-film deposition techniques such as chemical vapor deposition (CVD) and in particular atomic layer deposition (ALD) are suitable techniques for providing the inorganic material for embedding the phosphor particles. ALD reactions usually employ one or more precursors or reactants which carry the material to be deposited on a given surface (e.g. of the phosphor particles) and which react with the surface to thereby deposit the material thereon. A repeated exposure of the surface to such precursors enables highly controllable deposition of a thin film of the materials carried by the precursors.

While ALD may be highly advantageous e.g. in terms of deposition precision and controllability, for example, relatively high temperatures which may be required for the ALD process turned out to be a potential limitation. For example, on the one hand, high temperatures may damage the LED die while on the other hand, lower temperatures optimized for the LED die may be detrimental to the ALD process. In some instances, one or more ALD reagents (e.g., metal or metal oxide precursors, or oxygen sources) might be damaging to the LED die or its light-emitting surface.

It would be desirable to provide an improved method for manufacturing a light-emitting element configured for generating white light comprising a layer comprising phosphor. Accordingly, an inventive method for manufacturing a light-emitting element comprises: forming an initial layer on a surface of a substrate, the initial layer comprising phosphor particles; and providing an inorganic material to at least partially embed the phosphor particles of the initial layer so as to form a layer comprising the phosphor particles and the inorganic material. The layer comprising the phosphor particles and the inorganic material can be transferred from the substrate onto a surface of a light-emitting device. An inventive wavelength-converted light-emitting device comprises at least one light-emitting element that includes a wavelength-converting layer made by the inventive method. In some examples the wavelength-converting layer comprising the phosphor particles and the inorganic material includes a plurality of voids, in some instances air-filled voids.

In some examples, a light-emitting device is a light-emitting diode (LED), in particular an LED die, and the surface of the light-emitting device is a light-emitting surface of the LED (i.e., an outermost surface of the LED and/or LED die from which light is emitted). Thus, a light-emitting element manufactured with an inventive method can correspond to an LED with the layer comprising the phosphor particles and the inorganic material provided on its light-emitting surface. Thereby, the LED may be configured to emit blue light (e.g., blue light, deep blue light, and/or ultraviolet, UV, radiation). The phosphor particles may convert at least part of the blue light into yellow light to be mixed with non-converted blue light. In some examples, the LED is an LED configured to emit blue light, in particular with a mean wavelength in between 400 and 500 nm, in particular in between 440 and 470 nm. The light-emitting element may thus be configured to generate such mixed light which appears as white light to the human eye.

In some examples, the inorganic (non-luminescent) material may comprise at least one of $Al_2O_3$, $SiO_2$, $SnO_2$, $CrO_2$, $ZrO_2$, $HfO_2$, $Ta_2O_5$, $TiO_2$, $MgO_2$, and $ZnO$. The phosphor particles may in some examples comprise or consist of one or more SCASN phosphors, one or more 258 type phosphors, one or more SLA type phosphors, one or more Garnet phosphors, and/or one or more Mn(IV) doped fluoride type phosphors.

It is noted that the LED may correspond to a microLED of small diameter. Such microLEDs may for example be suitable for automotive headlight applications, where a corresponding lighting device (e.g. a light source for an automotive headlight) may comprise for example around 20000 microLEDs essentially forming a display for emitting light. Thus, in some examples the LED may have a diameter in between 10. and 70. μm, in particular in between 20. and 60. μm, in particular in between 30. and 50. μm. An example diameter of an LED may be 40 μm±5 μm, in particular ±2 μm.

The phosphor particles and the inorganic material are provided on a substrate (different from the LED die) that allows for later removal of the layer comprising the phosphor particles and the inorganic material. To this end, in some examples the substrate has low adherence and/or is essentially non-adhesive for the phosphor particles and the inorganic material. For example, the substrate may be inert, may have low wettability properties, and/or may have a low surface tension. In some examples in which the inorganic material is provided using an Atomic Layer Deposition (ALD) process, the surface can be incompatible with the ALD process (e.g., the surface can exhibit negligible reactivity with respect to one or more ALD reagents).

Thus, in some examples at least a part of the surface (e.g. the part of the surface onto which the phosphor particles are provided) of the substrate shows low surface tension and low wettability. Thereby, in an exemplary embodiment, "low wettability" is to be understood such that a contact angle between the surface of the substrate and a liquid is larger than 75°, in particular larger than 80°, in particular larger than 85°, in particular larger than 90°. As will be understood by a person skilled in the art, the contact angle of a surface is the angle, for example measured through a liquid on the surface, where a liquid—vapor interface meets the surface and quantifies the wettability of the surface by a liquid via the Young equation.

Such property of the surface to be non-adhesive for the phosphor particles and the inorganic material may be achieved by suitably choosing a material of the substrate and/or of the surface of the substrate. Thus, in an exemplary embodiment, a material at least of the surface of the substrate comprises at least one of polytetrafluoroethylene (PTFE, also referred to as Teflon), at least one perfluoroalkoxy alkane (PFA), and/or at least one fluorinated ethylene propylene (FEP); other similar materials can be employed.

It is noted that such material may be provided as material of the entire substrate or only of its surface. For example, the substrate may comprise a surface coated with the material. Thus, in some examples the surface of the substrate corresponds to a coating on a base material, i.e., the substrate corresponds to said base material and the coating. For example, the substrate may correspond to a solid plate (e.g., of glass or the like) coated with Teflon.

Thus, if for example any of these materials is chosen for or as part of the substrate and/or the substrate surface, and if the inorganic material is provided using an ALD process, ALD precursors may not be (or may be less) adsorbed on the or react with the surface of the substrate due to a strong bonding between a central Carbon and a surrounding, highly electronegative Fluorine. No or only a very weak bond between the surface of the substrate and the layer comprising the phosphor particles and the inorganic material is thus achieved. Thereby, an easy removal of the layer comprising the phosphor particles and the inorganic material is enabled, which in turn allows for a simple, e.g., substrate-free, transfer process of the layer comprising the phosphor particles and the inorganic material from the substrate onto a surface of the light-emitting device.

As a result, in particular by providing the substrate in this way, it becomes possible to decouple formation of the layer comprising the phosphor particles and the inorganic material from the light-emitting device. In this way, for example, temperatures which may be necessary for an ALD process for providing the inorganic material may be freely optimized for the ALD process without having to take into account, e.g., maximum temperatures that a light-emitting device can withstand. In some examples, one or more ALD reagents can be employed that might be damaging to the LED or its light-emitting surface. Thus, as the substrate is employed for providing a suitable basis for the formation of the layer comprising the phosphor particles and the inorganic material, the substrate may be understood as (and may in some examples be referred to as) an auxiliary substrate.

The initial layer comprising the phosphor particles may, e.g., correspond to a layer essentially comprising only the phosphor particles. In other words, in some examples, the initial layer includes only the phosphor particles and typical impurities such as organic compounds from handling in ambient environment. Impurities can also originate from additional chemicals that are used in the deposition method, e.g., a surfactant added to a suspension of phosphor particles. Thus, in some examples the initial layer comprises at least 90%, in particular at least 95%, in particular at least 98%, in particular at least 99% of phosphor particles. It is noted that the term "phosphor" as used herein refers to any wavelength-converting material, including but not limited to inorganic phosphor compounds. The phosphor particles may consist of a single material (up to the mentioned impurities) or may comprise several different phosphor materials that are mixed together or stacked on top of each other as sublayers of the initial layer. In other words, in some examples the initial layer of phosphor particles comprises at least one first layer comprising at least one first phosphor material and at least one second layer comprising at least one second phosphor material provided above or beneath the first layer comprising phosphor material. For example, the first layer may comprise or consist of YAG phosphor with a D50 value of 1-2 μm and the second layer may comprise or consist of a YAG phosphor with a D50 value of 3-5 μm. Such layer stack may advantageously combine a good optical coupling with a high conversion efficiency.

It is noted that also the layer comprising the phosphor particles and the inorganic material may be formed comprising sublayers, wherein each layer comprises different phosphor materials and/or different inorganic materials. Thus, in some examples the layer comprising the phosphor particles and the inorganic material comprises at least two layers, wherein each of the at least two layer comprises at least one of $Al_2O_3$, $SiO_2$, $SnO_2$, $CrO_2$, $ZrO_2$, $HfO_2$, $Ta_2O_5$, $TiO_2$, $MgO_2$, and ZnO. Thereby, in some examples at least two of the at least two layers differ in composition. For example, in particular a combination of $Al_2O_3$ and $TiO_2$ leads to a chemical stable layer structure with high refractive index that might improve the outcoupling efficiency of the device.

By mixing different phosphor materials and/or providing such sublayers tailoring of spectral properties of the light into which the phosphor converts the light emitted from the light-emitting element may be enabled.

As mentioned above, the phosphor particles may in some examples comprise or consist of one or more SCASN phosphors, one or more 258 type phosphors, one or more SLA type phosphors, one or more Garnet phosphors, and/or one or more Mn(IV) doped fluoride type phosphors. For example, the phosphor particles may in some examples comprise or consist of (Ba,Sr)2Si5N8:Eu (BSSN) and/or YAG:Ce (Yttrium, Aluminum, Garnet doped with about 2% Cerium). In particular in some instances Garnet phosphors can be highly advantageous.

The phosphor particles are advantageously provided as powder of phosphor particles. Thus, in some examples a D50 value of a particle size distribution of the phosphor particles is from 1.0 nm to 100. μm, in particular from 1.0 μm to 50. μm, in particular from 1.0 μm to 30. μm. As will be understood by a person skilled in the art, a D50 value refers to the median diameter or the medium value of the particle size distribution. In other words, a D50 value is the value of the particle diameter at 50% in the cumulative distribution. In some examples phosphor particles of 1.0 μm to 5.0 μm can be particularly suitable for microLED applications (for suitably and homogeneously covering individual microLEDs which may form pixel of a light-emitting display), whereas 5. to 25. μm particle sizes may be more suitable for higher power LEDs having diameters of a millimeter or more.

In some examples, providing the initial layer comprising phosphor particles comprises providing the phosphor particles employing at least one of sedimentation of phosphor particles; electrostatic spraying of phosphor particles; electrophoresis, EPD, of phosphor particles; and/or pressing, in particular uniaxial pressing, in particular powder densification of phosphor particles. For example, EPD may be of advantage as thereby, a good color uniformity and fast process time may be enabled.

Providing an inorganic material to embed at least partially the phosphor particles of the initial layer so as to form a layer comprising the phosphor particles and the inorganic material may be understood as converting the initial layer into a finished layer. To this end, in some examples, providing the inorganic material comprises forming an inorganic matrix at least partially embedding the phosphor particles of the initial layer. Thereby, in some examples at least partially embedding the phosphor particles of the initial layer comprises at least partially coating the phosphor particles, e.g., at least a fraction of the individual particles, with the inorganic material and thereby mechanically, physically and/or chemically connecting the phosphor particles, e.g., at least a fraction of the individual particles, with the inorganic material so as to bind or connect together the phosphor particles and form the layer comprising the phosphor particles and the inorganic material.

In other words, the inorganic material, e.g. Aluminum-Oxide, $Al_2O_3$, may on the one hand at least partially cover or coat the phosphor particles (e.g. at least a fraction thereof) and may on the other hand at least partially fill voids present in between phosphor particles. In this way, the inorganic material forms a solid mechanical (and/or physical and/or chemical) connection or bond between individual phosphor particles such that by providing the inorganic material in addition to the phosphor powder, a stable layer comprising phosphor particles and the inorganic material binding them together is formed. While the resulting layer comprising the phosphor particles and the inorganic material may be quite thin, having for example a thickness of only 10. to 20. μm, the combination of inorganic material and phosphor particles nevertheless results in a layer that is essentially self-supporting. In other words, in some examples, the layer comprising the phosphor particles and the inorganic material is self-supporting, i.e., retains its shape and structural integrity even when separated from the substrate and without being attached to another substrate or structure.

In some examples, providing the inorganic material comprises providing the inorganic material employing a Chemical Vapor Deposition, CVD, process. In some examples, providing the inorganic material employing an Atomic Layer Deposition (ALD) process, e.g., a pulsed CVD process which allows the growth of thin layers by applying one atomic layer of a material per cycle, may be particularly suitable for forming the layer comprising the phosphor particles and the inorganic material. Such ALD process is self-limiting and thus allows formation of very controlled and conformal layers.

In some examples, the ALD reaction for providing the inorganic material to the initial layer comprising the phosphor particles is split into (at least) two stages. In a first stage, a metal or metal oxide precursor may be fed into a reactor to adsorb and/or react with reactive groups on surfaces of phosphor particles present on the surface of the substrate. Non-adsorbed precursor molecules may be removed by reactor purging. In other words, in some examples, providing the inorganic material comprises providing the inorganic material employing an Atomic Layer Deposition, ALD, process comprising at least one stage (e.g., a first stage) of providing a metal and/or metal oxide precursor, e.g., onto surfaces of phosphor particles present on the surface of the substrate.

The metal and/or metal oxide precursor may in some examples comprise at least one metal organic compound, in particular comprising any one or more of a metal halide, an alkoxide, an amide, in particular $Al(CH_3)_3$ (TMA), $AlCl_3$ and/or $HAl(CH_3)_2$. For example, $Al_2O_3$ may be deposited by using an $Al(CH_3)_3$ (TMA), $AlCl_3$ or $HAl(CH_3)_2$ precursor in combination with a water, ozone or oxygen source provided in a second stage.

Thus, in some examples, in a second stage, the oxygen source may be fed into the reactor to react with the metal source on the surfaces of the phosphor particles. Purging of the reactor may be employed to remove remaining oxygen source molecules and hydrolysis products formed by condensation reactions. Thus, in some examples, providing the inorganic material comprises providing the inorganic material employing an Atomic Layer Deposition, ALD, process comprising at least one stage (e.g. second stage) of providing an oxygen source e.g. onto surfaces of the phosphor particles, in particular wherein the oxygen source comprises any one or more of water, ozone or oxygen.

Each of the two stages (also known as ALD cycle) leads to formation of a respective atomic layer (or monolayer) because of the self-limiting nature of the surface reaction. The stages (atomic layer reaction stages) may then be repeated plural times to form an ALD coating on the phosphor particles of desired property.

In some examples the inorganic material comprises any one or more of $Al_2O_3$, $SiO_2$, $SnO_2$, $CrO_2$, $ZrO_2$, $HfO_2$, $Ta_2O_5$, $TiO_2$. In particular, high refractive index materials such as $HfO_2$, $ZrO_2$ and $TiO_2$ may lead to an improved optical coupling. Further, a multilayer structure combining $Al_2O_3$ and for instance $TiO_2$ may be even more advantageous as such stack combines good optical properties with a high chemical and mechanical robustness.

By appropriately providing the initial layer comprising the phosphor particles and/or by appropriately providing the inorganic material, voids, in particular air voids, may be formed in the layer comprising the phosphor particles and the inorganic material. Such voids may promote scattering of light entering the layer comprising the phosphor particles and the inorganic material from the light-emitting device and/or of light generated in the layer comprising the phosphor particles and the inorganic material. Thus, in some examples, the layer comprising the phosphor particles and the inorganic material comprises a plurality of voids, in particular air-filled voids.

These voids were found to be advantageous as light scattering directs (collimates) the light-emitting device, which in case of light-emitting diodes usually is a Lambertian emission. For example in case of microLED light-emitting elements which may be part of a light-emitting display, directing and/or collimating the light in this way may advantageously enhance contrast between individual microLEDs (pixels of the display). The corresponding lighting device (e.g., a light source of an automotive headlight) may thus be enabled to project desired patterns or even text and/or symbols, e.g., onto a road surface.

Thus, in some examples 1.0% to 30.%, in particular 2.0% to 25.%, in particular 5.0% to 20.% of the volume of the layer comprising the phosphor particles and the inorganic material corresponds to the plurality of air voids. While the layer comprising the phosphor particles and the inorganic material may thus be a porous layer advantageously emitting directed white light if placed on a light-emitting surface of a blue LED, a layer comprising the phosphor particles and the inorganic material fabricated employing an inventive method may be a self-supporting layer which may be transferred from the auxiliary substrate onto a surface of the light-emitting device.

Employing an inventive method may enable formation of a layer comprising the phosphor particles and the inorganic material which may be thinner as compared to phosphor layers fabricated, e.g., employing sintering technology. In some examples the wavelength-converting layer can have a mean non-zero thickness less than about 0.10 millimeters. In some examples a mean thickness of the layer comprising the phosphor particles and the inorganic material is in between 8. μm and 25. μm, in particular in between 10. μm and 20. μm, in particular in between 12. μm and 17. μm. It is noted that conventional phosphor layers, e.g., ceramic phosphor layers, may have or be required to have thicknesses of more than 100 μm. In addition or alternatively, in some examples, providing the inorganic material to at least partially embed the phosphor particles of the initial layer so as to form the layer comprising the phosphor particles and the inorganic material does not comprise sintering. In other words, in some examples, the layer comprising the phosphor particles and the inorganic material is not sintered.

In some examples the layer comprising the phosphor particles and the inorganic material can be transferred from the substrate onto a surface of a light-emitting device (in some examples a light-emitting surface of a semiconductor light-emitting diode, in particular a light-emitting diode die). Thereby, in some examples, transferring the layer comprising the phosphor particles and the inorganic material from the substrate onto the surface of the light-emitting device comprises employing a substrate-free transfer process, in particular employing a heat or UV release member, e.g., a tape or substrate that may adhere to the layer comprising the phosphor particles and the inorganic material for lifting the layer from the substrate and that may be removed from the layer by applying heat or UV radiation. In addition or alternatively, a pick-and-place process may be employed for transferring the layer comprising the phosphor particles and the inorganic material. In other words, in some examples, transferring the layer comprising the phosphor particles and the inorganic material from the substrate to onto a light-emitting surface of a light-emitting device comprises employing a heat release tape and/or a pick-and-place process.

Such substrate-free transfer process may be enabled as the layer comprising the phosphor particles and the inorganic material formed when employing an inventive method is essentially self-supporting and free-standing. In addition, such substrate-free process may be in particular enabled when employing a substrate (an auxiliary substrate) having, e.g., a low surface tension or low wettability as described above as such substrate allows for the layer comprising the phosphor particles and the inorganic material to be removed in a particularly simple manner with little or no risk of damaging the wavelength-converting layer.

Apart from enabling a particularly simple transfer, the wavelength-converting layer comprising the phosphor particles and the inorganic material may be provided with suitable stability enabling a desirable processing, e.g., comprising one or more of polishing, etching, or laser structuring. It is further noted that if desired or necessary, any further layer may be provided onto the wavelength-converting layer comprising the phosphor particles and the inorganic material, e.g., using another ALD process, which then may be optimized in temperature respecting requirements of the light-emitting device, e.g. of the LED. For example, following transfer of the wavelength-converting layer comprising the phosphor particles and the inorganic material, a further ALD coating may be applied to provide and/or reinforce a bonding between the wavelength-converting layer comprising the phosphor particles and the inorganic material and the surface of the light-emitting device.

In some examples, such an additional, intervening layer of inorganic material used to adhere the wavelength-converting layer to the light-emitting surface of the LED can have substantially the same chemical composition as the inorganic material that binds together the phosphor particles of the wavelength-converting layer. In some of those examples, mean thickness of the intervening inorganic material between the light-emitting surface and those phosphor particles nearest the light-emitting surface can be substantially less (e.g., less than 80%, less than 70%, less than 50%, less than 30%, or less than 20%) than a mean thickness between adjacent phosphor particles within the wavelength-converting layer. In that way exposure of the LED or its light-emitting surface to reagents or reaction conditions of the ALD process can be reduced, relative to potential exposure that would have occurred during formation of the wavelength-converting layer.

In some examples, an intervening layer of inorganic material used to adhere the wavelength-converting layer to the light-emitting surface of the LED can differ in chemical composition from the inorganic material that binds together the phosphor particles of the wavelength-converting layer. In some of those examples, reagents or reaction conditions for forming the intervening layer of inorganic material can be employed that result in little or no damage to the LED or its light-emitting surface, even if the reagents or reaction conditions employed for forming the wavelength-converting layer are damaging to the LED or its light-emitting surface.

In some examples, the wavelength-converting layer comprising the phosphor particles and the inorganic material can be adhered to the light-emitting surface of the LED by an intervening layer of a polymeric adhesive, e.g., a silicone adhesive. One reason for employing the inorganic material to bind together the phosphor particles to form the wavelength-converting layer is to reduce or avoid degradation that is sometimes observed in conventional wavelength-converting layers that include phosphor particles embedded in a polymeric resin. By limiting the presence of the polymer to only the intervening adhesive layer, and using an inventive wavelength-converting layer that includes phosphor particles embedded in inorganic material, such degradation can be reduced relative to conventional layers having polymer-embedded phosphor particles.

It is further noted that in some examples, the surface of the substrate (of the auxiliary substrate) may be patterned, e.g., on a millimeter, micrometer, and/or nanometer scale. Such a patterned substrate may act as a suitable mask for structuring the layer comprising the phosphor particles and the inorganic material (e.g., for promoting enhanced light outcoupling) and/or for providing more than one layer comprising the phosphor particles and the inorganic material.

An inventive wavelength-converted light-emitting device comprises at least one semiconductor light-emitting device and at least one inventive wavelength-converting layer comprising the phosphor particles and the inorganic material as described above, with the wavelength-converting layer adhered to a light-emitting surface of the light-emitting device. In some examples the wavelength-converting layer comprising the phosphor particles and the inorganic material includes a plurality of voids, in particular air-filled voids (i.e., air voids). The wavelength-converting layer comprising the phosphor particles and the inorganic material may be provided with any of the described properties. In particular, in some examples 1.0% to 30.%, in particular 2.0% to 25.%, in particular 5.0% to 20.% of the volume of the layer comprising the phosphor particles and the inorganic material corresponds to the plurality of voids.

In some examples, the lighting device is a light source for an automotive lighting device such as a headlight or taillight, a flashlight, e.g., a flashlight of a mobile device such as a smartphone. In some examples, the lighting device may comprise a plurality of light-emitting elements comprising a plurality of corresponding light-emitting devices, wherein each of the light-emitting devices is an LED (e.g., a microLED) having a diameter in between 10. and 70. µm, in particular in between 20. and 60. µm, in particular in between 30. and 50. µm. An example diameter of an LED may in this embodiment be 40 µm±5 µm, in particular ±2 µm.

Figure 7A:
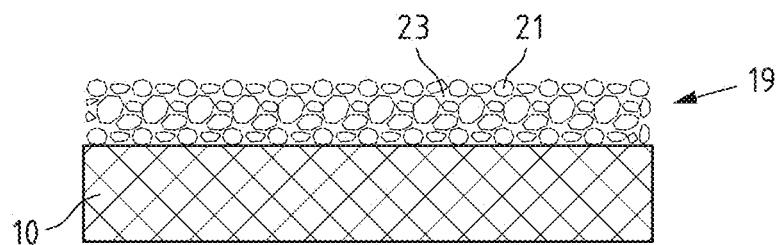
FIGS. 7A-7C illustrate schematically an example of an inventive method.
Figure 7B:
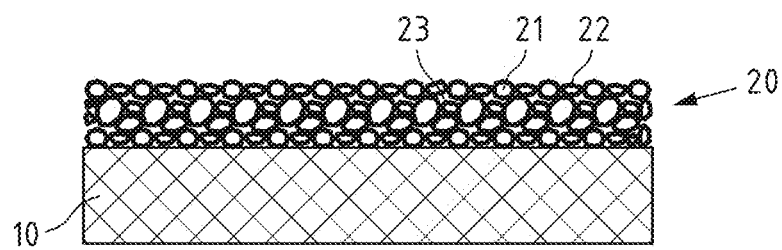
Figure 7C:
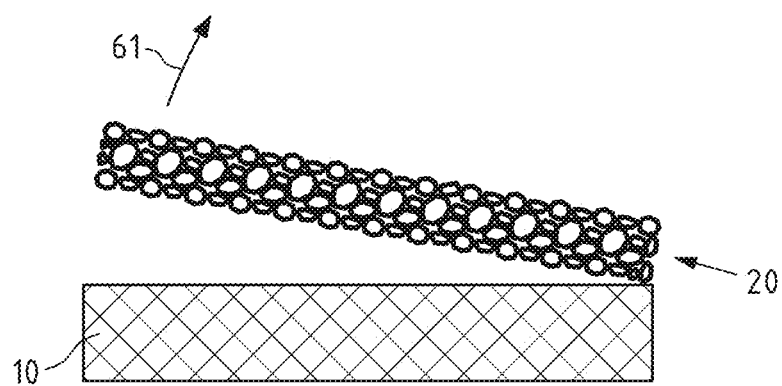

FIGS. 7A-7C illustrate schematically an example of an inventive method. In FIG. 7A, an initial layer 19 comprising a layer of phosphor particles 21 is provided on a surface of an auxiliary substrate 10, e.g., a Teflon substrate. In the example shown, (Ba,Sr)2Si5N8:Eu (BSSN) phosphor particles (in powder form) can be applied onto the Teflon substrate, e.g., by sedimentation forming an around 50. µm thick initial layer 19.

In FIG. 7B, $Al_2O_3$ (an example of an inorganic material) is deposited employing an Atomic Layer Deposition (ALD) process using $Al(CH_3)_3$ (TMA) and $H_2O$ as precursors at a growth temperature of 150° C. Thereby, a coating 22 is formed covering the phosphor particles 21 and forming a stable wavelength-converting layer 20 comprising the phosphor particles 21 and the inorganic material 22. A thickness of the coating 22 is around 500 nm. As can further be taken from FIG. 1B, voids 23 remain between the phosphor particles 21 which are filled with air. As described, these air voids 23 cause light scattering which in turn enables beneficially directed (collimated) light emitted from layer 20.

As illustrated in FIG. 7C, it was experimentally found that the wavelength-converting layer 20 formed by the ALD process and comprising the inorganic material and the phosphor particles 23 is mechanically sufficiently robust (i.e., self-supporting) to be released and separated from substrate 10 without breaking (as indicated by arrow 61 in FIG. 1C).

Figure 8A:
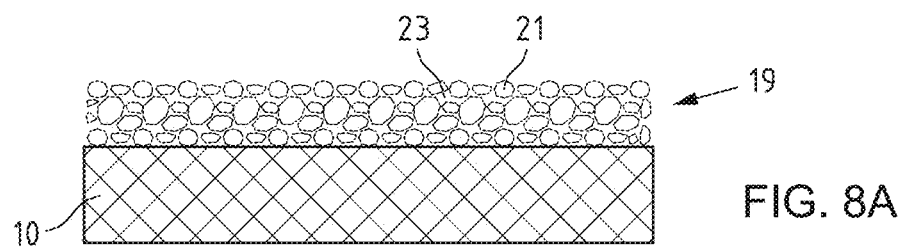
FIGS. 8A-8E illustrate schematically another example of an inventive method.
Figure 8B:
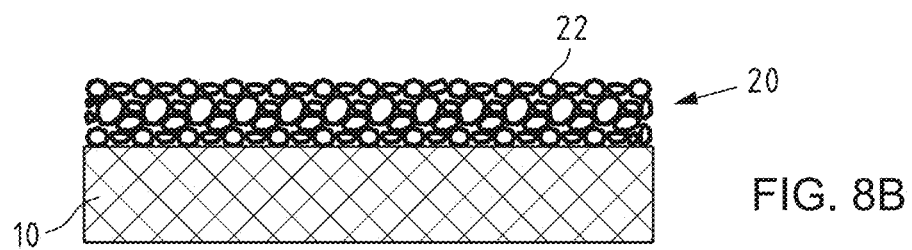

FIGS. 8A-8E illustrate schematically another example of an inventive method. FIGS. 8A-8E illustrate in particular an example process of transferring the layer comprising the phosphor particles and the inorganic material. FIGS. 8A and 8B correspond to FIGS. 7A and 7B such that description thereof is omitted.

Figure 8C:
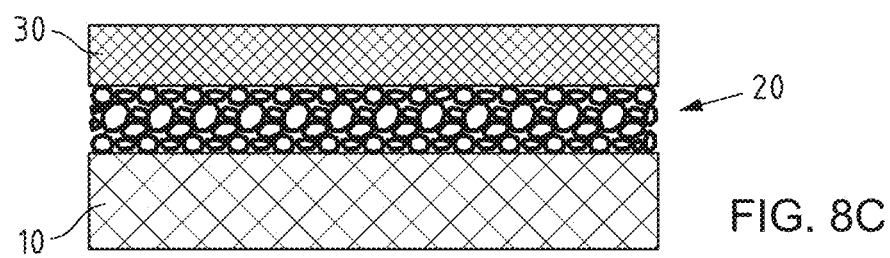
Figure 8D:
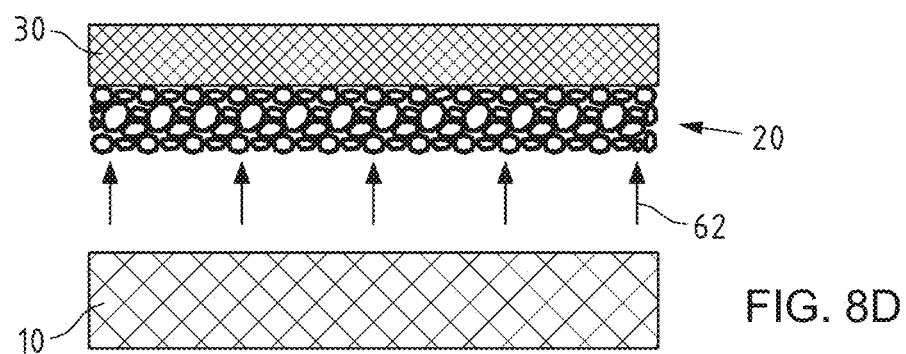
Figure 8E:
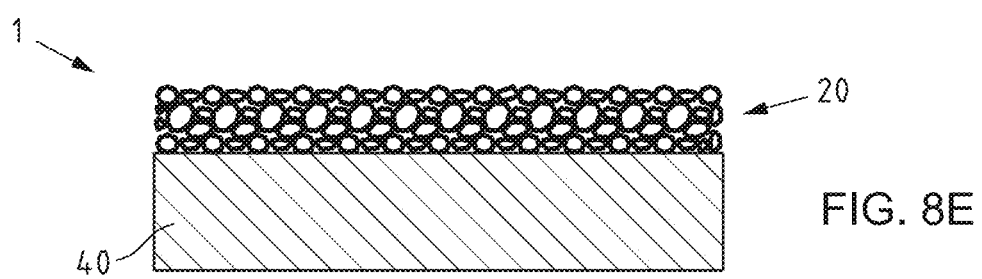

As shown in FIG. 8C, a heat or UV release member 30 (e.g., a flexible tape or a rigid substrate) is applied to the wavelength-converting layer 20 comprising the phosphor particles 21 and the inorganic material 22; the release member 30 adheres to the layer 20. Using the release member 30, layer 20 is lifted off the substrate 10 as indicated by arrows 62 in FIG. 8D. Further, using the release member 30, layer 20 is transferred to a surface of a Light-emitting Diode (LED) die 40 before the release member 30 is removed. The resulting light-emitting element 1 is shown in FIG. 8E.

FIGS. 9A-9E illustrate schematically another example of an inventive method. As illustrated in FIG. 9A, substrate 94 is patterned by providing gaps 96 enabling a simple way of patterning the final phosphor layer 20. Thus, elaborated post-processing steps, e.g., by photolithography, to pattern layer 20 can be avoided. In correspondence with, e.g., FIG. 7A, in FIG. 9A, respective initial layers 19 comprising phosphor particles are provided on surfaces of the respective main portions. Further, as described in the context of FIG. 7B, inorganic material is deposited in the stage of FIG. 9B so as to form respective layers 20 comprising the phosphor particles and the inorganic material. As illustrated in FIGS. 9C through 9E, the respective layers 20 are removed from the substrate 94 using a release member 30 and are transferred onto corresponding surfaces of respective light-emitting devices 40, thus forming respective light-emitting elements 1.

Figure 10:
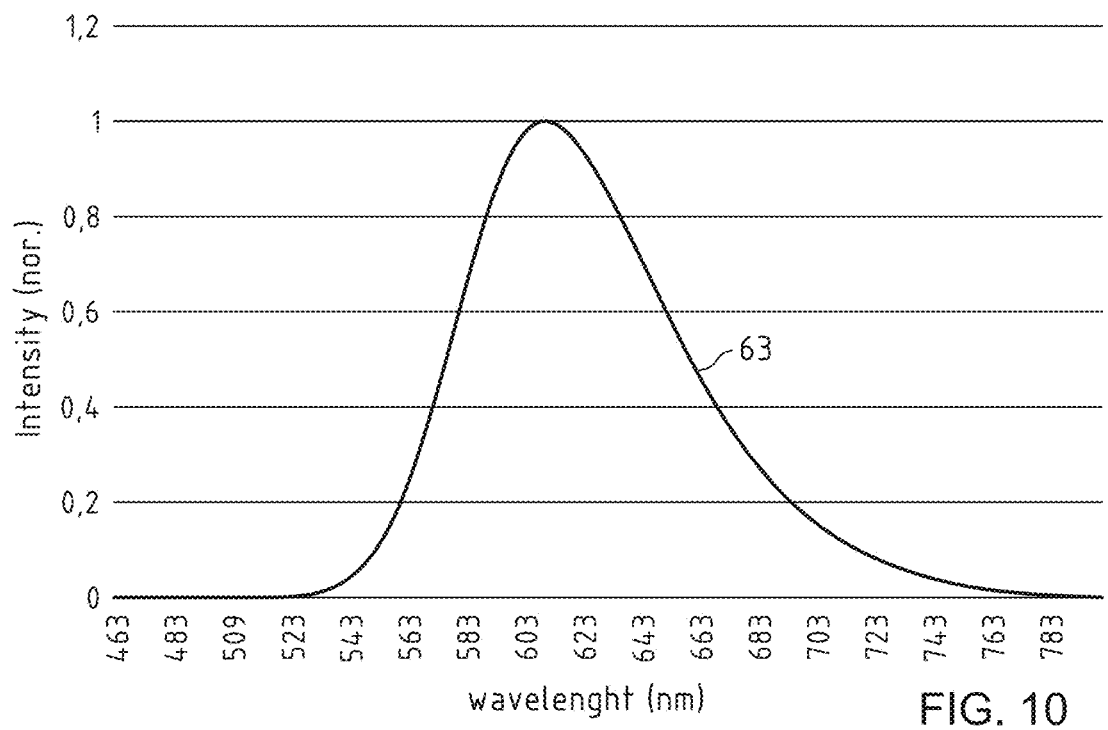
FIG. 10 shows a light spectrum generated by a light-emitting element manufactured according to an example of an inventive method.

FIG. 10 shows a graph 63 representing a spectrum of light generated using layer 20 formed by the process of FIGS. 7A to 7C. The resulting wavelength-converting layer 20 made by the process of FIGS. 7A to 7C exhibited a quantum efficiency of layer 20 (e.g., the ALD coated BSSN layer) of 97.9%.

Figure 11:
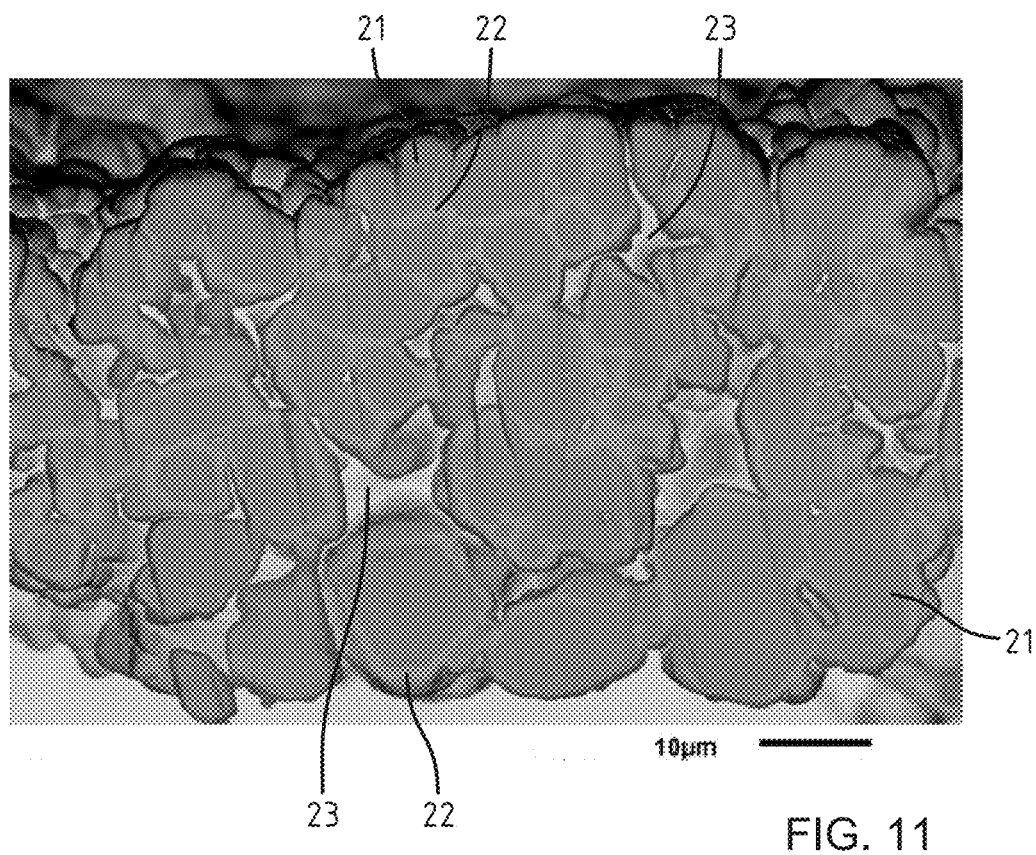
FIG. 11 shows a Surface Electron Microscope (SEM) photograph of a cross-section of an example of an inventive wavelength-converting phosphor layer.

FIG. 11 shows a cross sectional Surface Electron Microscope (SEM) photograph showing phosphor particles 21, ALD coating 22 and voids 23. The photograph confirms presence of a beneficial conformal ALD coating 22 around the phosphor particles 21.

In addition to the preceding, the following example embodiments fall within the scope of the present disclosure or appended claims:

Example 1. A method comprising: (A) forming on a surface of a substrate a layer of multiple phosphor particles; (B) forming or depositing inorganic material that at least partially embeds the layer of phosphor particles on the substrate so as to form a wavelength-converting layer comprising the phosphor particles and the inorganic material, the wavelength-converting layer having a first surface against the substrate surface and a second surface opposite the first surface; and (C) separating the wavelength-converting layer from the substrate, the inorganic material binding together the phosphor particles so that the wavelength-converting layer is self-supporting.

Example 2. The method of Example 1 further comprising, before separating the wavelength-converting layer from the substrate, adhering to the second surface of the wavelength-converting layer a release member, the wavelength-converting layer remaining adhered to the release member after separation from the substrate.

Example 3. The method of Example 1 further comprising adhering the wavelength-converting layer to a light-emitting surface of a semiconductor light-emitting device.

Example 4. The method of Example 3 further comprising: (D) before separating the wavelength-converting layer from the substrate, adhering to the second surface of the wavelength-converting layer a release member, the wavelength-converting layer remaining adhered to the release member after separation from the substrate; and (E) after adhering the wavelength-converting layer to the light-emitting device with the first surface of the wavelength-converting layer against the light-emitting surface, separating the release member from the wavelength-converting layer, the wavelength-converting layer remaining adhered to the light-emitting device after separation from the release member.

Example 5. The method of any one of Examples 3 or 4, the wavelength-converting layer being adhered to the light-emitting surface by an intervening layer of polymeric adhesive.

Example 6. The method of any one of Examples 3 or 4, the wavelength-converting layer being adhered to the light-emitting surface by an intervening layer of inorganic material having (i) substantially the same chemical composition as the inorganic material binding together the phosphor particles of the wavelength-converting layer and (ii) a mean thickness between the light-emitting surface and those phosphor particles nearest the light-emitting surface that is substantially less than a mean thickness between adjacent phosphor particles within the wavelength-converting layer.

Example 7. The method of any one of Examples 3 or 4, the wavelength-converting layer being adhered to the light-emitting surface by an intervening layer of inorganic material that differs in chemical composition from the inorganic material binding together the phosphor particles of the wavelength-converting layer.

Example 8. The method of Example 7, wherein: (i) forming or depositing the inorganic material binding together the phosphor particles comprises employing an Atomic Layer Deposition process that includes one or both of at least one stage of providing a metal or metal oxide precursor or at least one stage of providing an oxygen source; and (ii) one or more of the metal or metal oxide precursor, the oxygen source, or a reaction condition of one or more of the corresponding stages of the Atomic Layer Deposition process are damaging to the semiconductor light-emitting device or the light-emitting surface thereof.

Example 9. The method of any one of Examples 3 through 8, wherein separating the wavelength-converting layer from the substrate and adhering the wavelength-converting layer to the light-emitting surface of the semiconductor light-emitting device includes employing a substrate-free transfer process.

Example 10. The method of any one of Examples 1 through 9, the wavelength-converting layer having a non-zero mean thickness less than about 0.10 millimeters.

Example 11. The method of any one of Examples 1 through 10, the wavelength-converting layer having a mean thickness between about 8. μm and about 25. μm.

Example 12. The method of any one of Examples 1 through 11, at least a portion of the substrate surface exhibiting low wettability or negligible reactivity with respect to reagents employed for forming or depositing the inorganic material binding together the phosphor particles.

Example 13. The method of any one of Examples 1 through 12, the substrate surface including one or more of polytetrafluoroethylene, at least one perfluoroalkoxy alkane, or at least one fluorinated ethylene propylene.

Example 14. The method of any one of Examples 1 through 13, a D50 value of a particle size distribution of the phosphor particles being between about 1.0 μm and about 50. μm.

Example 15. The method of any one of Examples 1 through 14, wherein forming or depositing the inorganic material binding together the phosphor particles comprises employing an Atomic Layer Deposition process that includes one or both of at least one stage of providing a metal or metal oxide precursor or at least one stage of providing an oxygen source.

Example 16. The method of any one of Examples 1 through 15, the inorganic material binding together the phosphor particles including any one or more of $Al_2O_3$, $SiO_2$, $SnO_2$, $CrO_2$, $ZrO_2$, $HfO_2$, $Ta_2O_5$, or $TiO_2$.

Example 17. The method of any one of Examples 1 through 16, the wavelength-converting layer including a plurality of voids.

Example 18. The method of Examples 17, the plurality of voids occupying between about 1.0% and about 30.% of overall volume of the wavelength-converting layer.

Example 19. The method of any one of Examples 1 through 18, the wavelength-converting layer including two or more layers, each of the two or more layers including any one or more of $Al_2O_3$, $SiO_2$, $SnO_2$, $CrO_2$, $ZrO_2$, $HfO_2$, $Ta_2O_5$, or $TiO_2$.

Example 20. A wavelength-converting layer formed by the method of any one of Example 1 through 19.

Example 21. A wavelength-converting layer comprising: (a) a multitude of phosphor particles; (b) inorganic material, different from material of the phosphor particles, arranged so as to embed at least partially the phosphor particles and form the wavelength-converting layer, the inorganic material binding together the phosphor particles so that the wavelength-converting layer is self-supporting.

Example 22. A wavelength-converted light-emitting device comprising: (a) a semiconductor light-emitting device having a light-emitting surface; (b) a wavelength-converting layer adhered to the light-emitting surface of the semiconductor light-emitting device, the wavelength-converting layer comprising a multitude of phosphor particles and inorganic material, different from material of the phosphor particles, at least partially embedding the phosphor particles and binding together the phosphor particles; and (c) an intervening layer positioned between the light-emitting surface and the wavelength-converting layer and adhering the wavelength-converting layer to the light-emitting surface, the intervening layer comprising a polymeric adhesive.

Example 23. A wavelength-converted light-emitting device comprising: (a) a semiconductor light-emitting device having a light-emitting surface; (b) a wavelength-converting layer adhered to the light-emitting surface of the semiconductor light-emitting device, the wavelength-converting layer comprising a multitude of phosphor particles and inorganic material, different from material of the phosphor particles, at least partially embedding the phosphor particles and binding together the phosphor particles; and (c) an intervening layer positioned between the light-emitting surface and the wavelength-converting layer and adhering the wavelength-converting layer to the light-emitting surface, the intervening layer comprising inorganic material having (i) substantially the same chemical composition as the inorganic material binding together the phosphor particles of the wavelength-converting layer and (ii) a mean thickness between the light-emitting surface and those phosphor particles nearest the light-emitting surface that is substantially less than a mean thickness between adjacent phosphor particles within the wavelength-converting layer.

Example 24. A wavelength-converted light-emitting device comprising: (a) a semiconductor light-emitting device having a light-emitting surface; (b) a wavelength-converting layer adhered to the light-emitting surface of the semiconductor light-emitting device, the wavelength-converting layer comprising a multitude of phosphor particles and inorganic material, different from material of the phosphor particles, at least partially embedding the phosphor particles and binding together the phosphor particles; and (c) an intervening layer positioned between the light-emitting surface and the wavelength-converting layer and adhering the wavelength-converting layer to the light-emitting surface, the intervening layer comprising inorganic material that differs in chemical composition from the inorganic material binding together the phosphor particles of the wavelength-converting layer.

Example 25. The device of any one of Examples 21 through 24, the wavelength-converting layer having a non-zero mean thickness less than about 0.10 millimeters.

Example 26. The device of any one of Examples 21 through 25, the wavelength-converting layer having a mean thickness between about 8. μm and about 25. μm.

Example 27. The device of any one of Examples 21 through 26, a D50 value of a particle size distribution of the phosphor particles being between about 1.0 μm and about 50. μm.

Example 28. The device of any one of Examples 21 through 27, the inorganic material binding together the phosphor particles including any one or more of $Al_2O_3$, $SiO_2$, $SnO_2$, $CrO_2$, $ZrO_2$, $HfO_2$, $Ta_2O_5$, or $TiO_2$.

Example 29. The device of any one of Examples 21 through 28, the wavelength-converting layer including a plurality of voids.

Example 30. The device of Example 29, the plurality of voids occupying between about 1.0% and about 30.% of overall volume of the wavelength-converting layer.

Example 31. The device of any one of Examples 21 through 30, the wavelength-converting layer including two or more layers, each of the two or more layers including any one or more of $Al_2O_3$, $SiO_2$, $SnO_2$, $CrO_2$, $ZrO_2$, $HfO_2$, $Ta_2O_5$, or $TiO_2$.

Example 32. The device of any one of Examples 21 through 31 wherein the wavelength-converting layer is made by the method of any one of Examples 1 through 19.

This disclosure is illustrative and not limiting. Further modifications will be apparent to one skilled in the art in light of the present disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, for any numerical quantity, including when terms are employed such as "about equal to," "substantially equal to," "greater than about," "less than about," and so forth are used, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A method comprising:
   forming on a surface of a substrate a layer of multiple phosphor particles;
   forming or depositing inorganic material that at least partially embeds the layer of phosphor particles on the substrate so as to form a wavelength-converting layer comprising the phosphor particles and the inorganic material, the wavelength-converting layer having a first surface against the substrate surface and a second surface opposite the first surface; and
   separating the wavelength-converting layer from the substrate, the inorganic material binding together the phosphor particles so that the wavelength-converting layer is self-supporting.

2. The method of claim 1 further comprising adhering the wavelength-converting layer to a light-emitting surface of a semiconductor light-emitting device.

3. The method of claim 2 further comprising:
   before separating the wavelength-converting layer from the substrate, adhering to the second surface of the wavelength-converting layer a release member, the wavelength-converting layer remaining adhered to the release member after separation from the substrate; and
   after adhering the wavelength-converting layer to the light-emitting device with the first surface of the wavelength-converting layer against the light-emitting surface, separating the release member from the wavelength-converting layer, the wavelength-converting layer remaining adhered to the light-emitting device after separation from the release member.

4. The method of claim 2, the wavelength-converting layer being adhered to the light-emitting surface by only one of: (i) an intervening layer of polymeric adhesive; (ii) an intervening layer of inorganic material having substantially the same chemical composition as the inorganic material binding together the phosphor particles of the wavelength-converting layer, and having a mean thickness between the light-emitting surface and those phosphor particles nearest the light-emitting surface that is substantially less than a mean thickness between adjacent phosphor particles within the wavelength-converting layer; or (iii) an intervening layer of inorganic material that differs in chemical composition from the inorganic material binding together the phosphor particles of the wavelength-converting layer.

5. The method of claim 4, wherein:
   forming or depositing the inorganic material binding together the phosphor particles comprises employing an Atomic Layer Deposition process that includes one or both of at least one stage of providing a metal or metal oxide precursor or at least one stage of providing an oxygen source; and
   one or more of the metal or metal oxide precursor, the oxygen source, or a reaction condition of one or more of the corresponding stages of the Atomic Layer Deposition process are damaging to the semiconductor light-emitting device or the light-emitting surface thereof.

6. The method of claim 2, wherein separating the wavelength-converting layer from the substrate and adhering the wavelength-converting layer to the light-emitting surface of the semiconductor light-emitting device includes employing a substrate-free transfer process.

7. The method of claim 1, the wavelength-converting layer having a non-zero mean thickness less than about 0.10 millimeters.

8. The method of claim 1, at least a portion of the substrate surface exhibiting low wettability or negligible reactivity with respect to reagents employed for forming or depositing the inorganic material binding together the phosphor particles.

9. The method of claim 1, the substrate surface including one or more of polytetrafluoroethylene, at least one perfluoroalkoxy alkane, or at least one fluorinated ethylene propylene.

10. The method of claim 1, a D50 value of a particle size distribution of the phosphor particles being between about 1.0 μm and about 50. μm.

11. The method of claim 1, wherein forming or depositing the inorganic material binding together the phosphor particles comprises employing an Atomic Layer Deposition process that includes one or both of at least one stage of providing a metal or metal oxide precursor or at least one stage of providing an oxygen source.

12. The method of claim 1, the wavelength-converting layer including a plurality of voids, the plurality of voids occupying between about 1.0% and about 30.% of overall volume of the wavelength-converting layer.

13. A wavelength-converting layer comprising:
   a multitude of phosphor particles;
   inorganic material, different from material of the phosphor particles, arranged so as to embed at least partially the phosphor particles and form the wavelength-converting layer, the inorganic material binding together the phosphor particles so that the wavelength-converting layer is self-supporting.

14. The wavelength-converting layer of claim 13 further comprising a release member adhered to a first surface of the wavelength-converting layer, a second, opposite surface of the wavelength-converting layer being exposed and free of any attached layer, member, or device.

15. A wavelength-converted light-emitting device incorporating the wavelength-converting layer of claim 13, comprising:
   a semiconductor light-emitting device having a light-emitting surface;
   the wavelength-converting layer of claim 13 adhered to the light-emitting surface of the semiconductor light-emitting device; and
   an intervening layer of polymeric adhesive positioned between the light-emitting surface and the wavelength-converting layer and adhering the wavelength-converting layer to the light-emitting surface.

16. A wavelength-converted light-emitting device incorporating the wavelength-converting layer of claim 13, comprising:
   a semiconductor light-emitting device having a light-emitting surface;
   the wavelength-converting layer of claim 13 adhered to the light-emitting surface of the semiconductor light-emitting device; and
   an intervening layer positioned between the light-emitting surface and the wavelength-converting layer and adhering the wavelength-converting layer to the light-emitting surface, the intervening layer comprising inorganic material having (i) substantially the same chemical composition as the inorganic material binding together the phosphor particles of the wavelength-converting layer and (ii) a mean thickness between the light-emitting surface and those phosphor particles nearest the light-emitting surface that is substantially less than a mean thickness between adjacent phosphor particles within the wavelength-converting layer.

17. A wavelength-converted light-emitting device incorporating the wavelength-converting layer of claim 13, comprising:
   a semiconductor light-emitting device having a light-emitting surface;
   the wavelength-converting layer of claim 13 adhered to the light-emitting surface of the semiconductor light-emitting device; and
   an intervening layer positioned between the light-emitting surface and the wavelength-converting layer and adhering the wavelength-converting layer to the light-emitting surface, the intervening layer comprising inorganic material that differs in chemical composition from the inorganic material binding together the phosphor particles of the wavelength-converting layer.

18. The wavelength-converting layer of claim 13, the wavelength-converting layer having a non-zero mean thickness less than about 0.10 millimeters.

19. The wavelength-converting layer of claim 13, a D50 value of a particle size distribution of the phosphor particles being between about 1.0 μm and about 50. μm.

20. The wavelength-converting layer of claim 13, the wavelength-converting layer including a plurality of voids, the plurality of voids occupying between about 1.0% and about 30.% of overall volume of the wavelength-converting layer.

* * * * *